PHASE LOCK SYSTEM

Filed Sept. 16, 1957

INVENTORS
EDUARD HERMAN HUGENHOLTZ
ALLISTAIR MACALPINE TOWLE
BY
Frank R. Trifari
AGENT United States Patent Office 2,956,239
Patented Oct. 11, 1960

2,956,239

PHASE LOCK SYSTEM

Eduard Herman Hugenholtz, Toronto, Ontario, and Allistair MacAlpine Towle, Willowdale, Ontario, Canada, assignors to North American Philips Company, Inc., New York, N.Y., a corporation of Delaware Filed Sept. 16, 1957, Ser. No. 684,273

Claims priority, application Canada Sept. 22, 1956

14 Claims. (Cl. 331—4)

This invention relates to an oscillator frequency control system wherein the oscillator frequency is controlled and stabilized with reference to an oscillation of standard frequency. An oscillator frequency stabilisation system of this type is shown in United States Patent No. 2,756,333.

In United States Patent No. 2,756,333 there is shown an oscillator frequency stabilization system wherein a local oscillator of a superheterodyne receiver is adjustable in steps of, for instance, 100 kilocycles/second (kc./s.) and stabilized with reference to frequencies which are harmonics of a 100 kc./s. crystal controlled oscillator.

In carrying out the invention as described in the patent specification supra, the 100 kc./s. oscillator output is first applied to a frequency multiplier and then a pulse generator to provide a spectrum of pulses which are harmonics of 1 megacycle (mc./s.). The 1 mc./s. pulse spectrum is mixed with the output of the oscillator whose frequency is to be controlled to produce beat frequencies, one of which is selected by appropriate filter circuits and applied to a frequency discriminator to provide a direct current voltage for coarse frequency control, the frequency discriminator being broadly tuned to the desired beat frequency.

Fine frequency control is provided for by, in addition to the above, mixing the beat frequency with a further spectrum of pulses which may be, for example, harmonics of 100 kc./s. in a normally cut-off mixing stage or phase discriminator. This mixing stage is released from cut-off by the 100 kc./s. pulse spectrum and a control voltage is produced in response to phase divergencies between the applied signals. The control voltage produced by the phase discriminator is applied to a frequency controlling device, such as a reactance tube, in addition to the control voltage supplied by the discriminator, to provide fine frequency control.

The circuit of the present invention differs from that of United States Patent No. 2,756,333 in that the frequency discriminator does not contribute to the control voltage for low frequencies and so cannot contribute any direct current voltage control once phase lock with the reference frequency is attained. In this manner slight mistuning of the frequency discriminator cannot cause a false frequency lock. The control of the oscillator frequency may be continuous rather than stepped.

In addition to the above, in carrying out the present invention the beat frequency supplied to the pulse mixer or phase comparison circuit may be supplied through the tuned circuit of the frequency discriminator or other frequency selective means, thus substantially eliminating the possibility of false locking.

Since the influence of the frequency and phase discriminators are limited to a narrow band of frequencies, an oscillator hunting system may be employed to bring the frequency of the oscillator to be controlled into the region of desired lock.

The invention will now be described with reference to the figure of the drawing in which.

Figure 1:
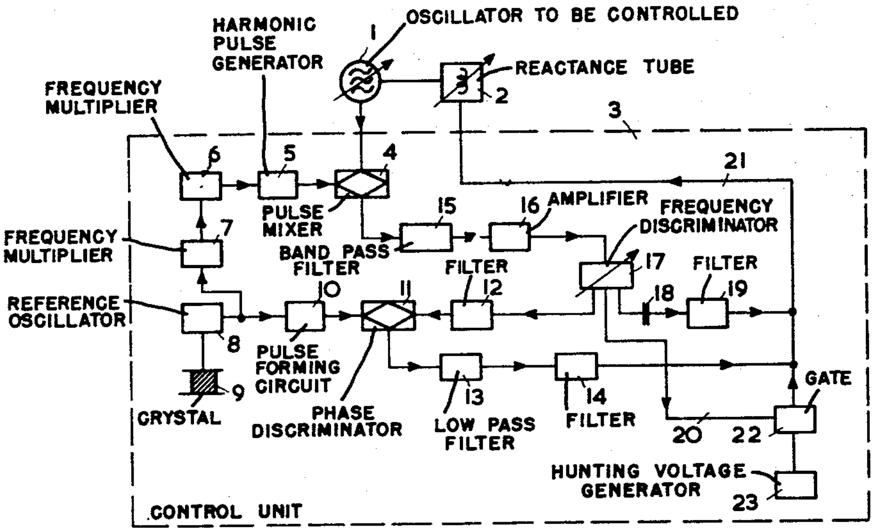
Figure 1 shows a block diagram of an embodiment thereof.

Referring now to Figure 1, an oscillator 1 is shown of which it is desired to control the frequency with respect to a reference frequency, i.e. that of crystal controlled oscillator 8 of control unit 3. A reactance tube or other equivalent frequency controlling means 2 is associated with oscillator 1 and is actuated by a control voltage supplied from control unit 3 via lead 21.

The control unit 3 comprises a crystal controlled oscillator 8 having a frequency controlling crystal 9 associated therewith. The oscillator 8 may oscillate at a frequency of, for instance, 100 kc./s. The output of oscillator 8 is applied to cascaded multipliers 7 and 6 to produce a sine wave oscillation in 6 of 1 mc./s. It is not necessary to maintain any definite phase relations between the output of oscillator 8 and multiplier 6.

The 1 mc./s. output of multiplier 6 is applied to a harmonic pulse generator 5 which produces a pulse output at a recurrence frequency of 1 mc./s. and rich in harmonics. The pulse output from generator 5 is applied to a normally cut-off pulse mixer 4 to release same. The output of oscillator 1 which may be, for instance, 20 mc./s. is also supplied to mixer 4 and a beat frequency spectrum is thereby produced.

The beat frequency spectrum from mixer 4 is applied to a circuit 15 selective to a band of frequencies, for instance 1.6 to 2 mc./s. This selected band is amplified in an amplifier 16 and applied to a selective phase discriminator 17. Further selective circuits may be used ahead of the frequency discriminator if deemed necessary. It is desirable that the band of frequencies selected by the frequency discriminator be limited to the frequency divergencies normally expected from oscillator 1. It should be noted here that discriminator 17 is tunable stepwise in steps of, for instance, 100 kc./s. between 1.6 and 1.9 mc./s. The discriminator may be also tunable stepwise between 1.1 and 1.4 mc./s. The output of discriminator 17 is applied through capacitor 18 and a filter 19 to control voltage lead 21.

The beat frequency selected by the frequency discriminator is also supplied through a further filter circuit 12 and applied to a normally cut-off type phase discriminator 11. The 100 kc./s. output of oscillator 8 is applied to a pulse forming circuit 10 which produces a pulse output having a recurrence frequency of 100 kc./s. The 100 kc./s. pulse voltage is applied to the phase discriminator 11 wherein it is mixed with the beat frequency voltage from discriminator 17 to produce an output voltage which varies with the phase of the two applied voltages. The output voltage is applied through a low pass filter 13, filter 14 and to control line 21. Filter 13 limits the output of phase discriminator to low frequencies, i.e. less than 200 c./s. Filter circuits 14 and 19 reject frequencies that are harmonics of 50 kc./s.

A hunting voltage generator 23 produces an alternating current voltage having a frequency of, for instance, 10 c./s. which is applied through a gate 22 to lead 21 to provide for hunting of the frequency of oscillator 1 Gate 22 is controlled by a direct current output of discriminator 17.

In the operation of the circuit the frequency of oscillator 1 is swept by the output of hunting voltage generator 23. When the frequency of oscillator 1 approaches the frequency of a harmonic of the 1 mc./s. spectrum of pulse generator 5 to produce a beat frequency in the frequency region to which discriminator 17 is tuned, a voltage change is produced by the discriminator which tends to slow up the hunting of oscillator 1 frequency when the beat frequency produced in mixer 4 approaches the centre tuning frequency of discrimniator 17.

The operation of discriminator 17 will now be described with reference to its characteric curve illustrated by Figure 2, it being assumed that the proper direction of control is provided to facilitate locking at *c*, the central point on the curve. As the frequency of the beat frequency is swept from *a* to *b*, the discriminator produces a surge which when applied to control lead 21 tends to speed up the hunting movement. After passing *b*, the surge produced is in the direction to slow down the hunting movement to a value determined by the alternating current coupling circuit of the discriminator to lead 21 which includes capacitor 18.

When point *c* is passed at a slow hunting speed and the beat frequency is close to a multiple of the 100 kc./s. pulse recurrence frequency supplied to mixer 11, a control voltage is applied by mixer 11 and filters 13 and 14 to control lead 21 and control 2 to provide a phase lock. The phase lock stops hunting due to its negative feedback action. The cancellation of the hunting action may be aided by a hunting clamping circuit such as that at 22 wherein when the least frequency reaches the proper value, the hunting voltage is isolated from lead 21 by gate circuit 22 under control of a direct current voltage produced by discriminator 17.

The cut-off frequency of the phase lock circuit should be several times that of the hunting frequency to enable proper locking. The frequency cut-off in the output circuit of the phase lock circiut (11, 13, 14) could result in loop phase exceeding the critical phase shift at some frequency but the frequency discriminator contributes a substantial part of the low frequency signal in the control loop and its component, having basically 90° less phase shift, will reduce the total loop phase shift to assure a generous phase margin. In order to avoid excessive phase shift in the phase lock circuit wherein the influence of the phase lock system is dominant, the bandwidth of filter 13 must be of the order of 4 or 5 times the cross-over frequency between the phase lock and the frequency discriminator circuit. The cross-over is the frequency for which the phase and frequency discriminators produce equal amounts of control influence.

Figure 2:
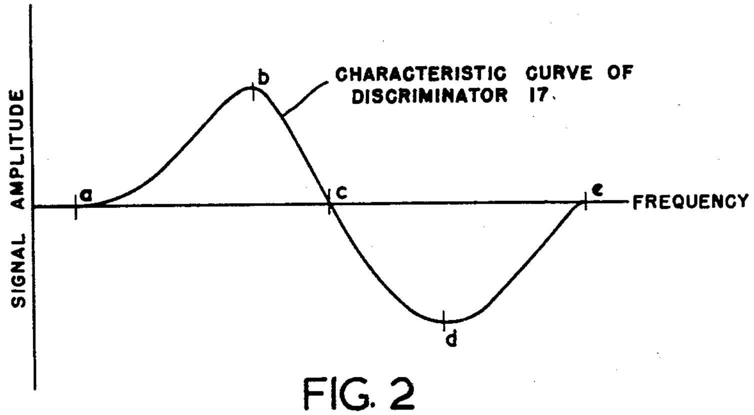
Figure 2 shows a frequency discriminator response curve helpful in explaining the operation of the invention.

Considering the locking possibilities wherein the discriminator characteristic is opposite to that of Figure 2, the wrong image is considered, the output of the frequency discriminator speeds up the hunting as the frequency of the beat approaches the centre frequency of the discriminator tuning so that phase locking is prevented. Even if a phase lock should have taken place, the direction of the control slope of the frequency discriminator in conjunction with the direction of the frequency control is such, that the control loop would be in an unstable condition, which would start an oscillation and result in breaking of the phase lock.

The system as described has the advantage that slight mistuning of the centre frequency of the discriminator does not lead to false lock. The system is not critical in adjustment and can be used for either transmission or reception purposes. Because of the selectivity of the circuitry associated with the frequency discriminator, an amplitude gate is not necessary in most cases. Provision is made for selection of either image of the beat frequency by providing for switching of the discriminator characteristic. Other pulse recurrence frequencies or further tuned reference oscillators may be used to provide larger or smaller frequency steps in tuning. The oscillator is preferably step tuned close to the desired frequencies but may be continuously tuned. Filters 14 and 19 may be combined as one. It is not necessary for the operation of this invention that a pulse reference voltage be used. Mixer 4 may be replaced by a conventional sine wave mixer. Phase detector 11 may take other forms than that described for use in the embodiment described. Capacitor 18 may be replaced by a transformer or other suitable direct current blocking means.

Although a particular embodiment of the invention has been described, it is obvious that numerous modifications may be made without departing from the spirit and scope of the invention which is defined in the appended claims.

What is claimed is:

1. In a frequency control system, a first tunable oscillator the frequency of which is adapted to be controlled by a control circuit, a second source of reference oscillations, means mixing the output of said first oscillator and the said reference frequency to produce a beat frequency spectrum, a frequency discriminator, a means for selecting a desired beat frequency from said spectrum and applying it to said frequency discriminator thereby to produce a control voltage, direct current blocking means coupling said control voltage to said control circuit so as to shift the frequency of said oscillator to produce a beat frequency substantially corresponding to the tuning of said selective means, and a phase discriminator connected for comparing said selected beat frequency with a third oscillation frequency, stabilized with respect to said reference oscillations, to produce a control voltage which is adapted to phase lock said first oscillator frequency with respect to said reference oscillations.

2. The system as claimed in claim 1, including a hunting voltage generator connected to apply a hunting voltage to said control circuit.

3. The system as claimed in claim 1, wherein said reference oscillations and said third oscillations are derived from a common source.

4. In a system provided with two sources of alternating voltage and a voltage actuated control device for adjusting the frequency of one of the sources, an apparatus for maintaining a predetermined difference frequency between said sources comprising, a mixer, means impressing said alternating voltages on said mixer to produce a difference frequency, a frequency discriminator, selective means tuned to a desired difference frequency for applying said desired difference frequency to said frequency discriminator, means for adjusting said control device to produce a difference frequency substantially that of said desired difference frequency, direct current blocking coupling means connected for impressing the output voltage of said frequency discriminator on said control device to counteract frequency deviations of said difference frequency from said desired frequency, a phase discriminator, a source of a further alternating voltage synchronized with the other of said two sources, and means deriving said difference frequency from said frequency discriminator and impressing said derived difference frequency and said further alternating voltage on said phase discriminator to produce an output voltage which is impressed on said control device to effect a phase lock condition between said two sources of alternating voltage.

5. In an oscillator frequency control system, means to control the frequency of a first tunable oscillator with respect to the frequency of a second oscillator comprising, a pulse generator controlled by said second oscillator to produce a pulse frequency spectrum having a recurrence frequency which is a harmonic of the frequency of said second oscillator, a mixing circuit, means coupling said frequency spectrum and the output of the first oscillator to said mixing circuit to produce a spectrum of beat frequencies, a frequency discriminator selectively tuned to one of the best frequencies of said spectrum and connected to said mixing circuit to receive said spectrum of beat frequencies, a control circuit connected to be operative on the frequency of said first oscillator, direct current blocking means coupling the output of said frequency discriminator to said control circuit to tend to bring the selected beat frequency to the center tuning of said frequency discriminator, a phase discriminator, selective means for supplying said one of said beat frequencies from said frequency discriminator to said phase discriminator, and means applying the output of said second oscillator to said phase discriminator to produce a control voltage, and means applying said control voltage to said control circuit for phase locking the frequency of said tunable oscillator to a frequency which is a harmonic of the frequency of said control oscillator.

6. In a frequency control circuit, a tunable oscillator having a frequency control circuit, a source of reference oscillations, means producing a series of pulses rich in harmonics whose recurrence frequency is a harmonic of the frequency of said reference oscillations, a first normally cut-off mixer, means supplying the output of said tunable oscillator and said series of pulses to said mixer to release it from cut-off to produce a beat frequency spectrum, a frequency discriminator selectively tuned to a beat frequency to produce an output voltage varying with the center frequency of said selected beat, direct current blocking means coupling said output voltage to said control circuit to counteract frequency deviations of said tunable oscillator, a second normally cut-off mixer type of phase discriminator, means for supplying said selected beat frequency from said frequency discriminator and a series of pulses, synchronized with said reference oscillations, to said second mixer to periodically release it from cut-off and produce an output voltage which varies with the phase of said selected beat frequency as compared to said synchronized pulses, and means supplying the output voltage of said second mixer to the said control circuit to lock the frequency of said tunable oscillator with respect to said reference oscillations.

7. In a system provided with first and second sources of alternating voltages, the voltage of said first source being constituted by recurrent pulses and the frequency of the voltage of said second source being high relative to the periodicity of said pulses, and a control device for adjusting the frequency of said second source, an apparatus for maintaining a predetermined frequency difference between said sources of voltage comprising a normally blocked mixing circuit, said circuit being arranged to be operative only for the duration of said pulses to produce a spectrum of beat frequencies which vary with the difference in frequency between said two sources, a tuned frequency discriminator, means selecting one of said beat frequencies and applying it to said tuned frequency discriminator which thereby produces an output voltage varying with the relationship of the beat frequency to the center tuning of said frequency discriminator, direct current blocking coupling means connected for supplying the frequency discriminator output voltage to said control device to counteract variations of said beat frequency, a normally cut-off mixer type phase discriminator, and means supplying said selected beat frequency from said frequency discriminator and a further series of pulses sub-harmonically related to and synchronized with said source of recurrent pulses to said phase discriminator to produce an output voltage which is applied to said control device to maintain the said selected beat frequency constant.

8. The system as claimed in claim 4, wherein said means for adjusting said control device is constituted by an alternating current generator having a frequency which is low with respect to that of said two sources.

9. The system as claimed in claim 4 wherein said other of said alternating voltages is constituted by recurrent pulses.

10. The system as claimed in claim 4 wherein said further alternating voltage is constituted by recurrent pulses.

11. A frequency control circuit as set forth in claim 6, including a hunting voltage generator connected to supply a hunting voltage to said control circuit.

12. The control circuit as set forth in claim 11, including means wherein the hunting voltage is removed from said control circuit on the achievement of frequency lock.

13. The control circuit of claim 6, wherein the frequency of the reference oscillations is low with respect to the frequency of said tunable oscillator.

14. The system of claim 7 wherein means are provided to supply a hunting voltage to said control device.

References Cited in the file of this patent

UNITED STATES PATENTS

| | | |
|---|---|---|
| 2,287,925 | White | June 30, 1942 |
| 2,379,689 | Crosby | July 3, 1945 |
| 2,756,333 | Hugenholtz | July 24, 1956 |